(12) United States Patent
Anderl et al.

(10) Patent No.: US 10,303,067 B2
(45) Date of Patent: May 28, 2019

(54) COOLER FOR USE IN A DEVICE IN A VACUUM

(71) Applicant: Carl Zeiss SMT GmbH, Oberkochen (DE)

(72) Inventors: Willi Anderl, Huettlingen (DE); Bernhard Weigl, Steinheim (DE); Ann-Kathrin Wandner, Lorch-Waldhausen (DE); Holger Kierey, Aalen (DE); Arno Schmittner, Koenigsbronn (DE); Markus Bauer, Oberkochen (DE); Marcus Schmelzeisen, Essingen (DE); Andreas Kolloch, Aalen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 47 days.

(21) Appl. No.: 15/079,617

(22) Filed: Mar. 24, 2016

(65) Prior Publication Data

US 2016/0299443 A1    Oct. 13, 2016

(30) Foreign Application Priority Data

Apr. 7, 2015  (DE) .................. 10 2015 206 114

(51) Int. Cl.
*G03B 27/42*      (2006.01)
*G03F 7/20*       (2006.01)
(Continued)

(52) U.S. Cl.
CPC ......... *G03F 7/70891* (2013.01); *F28D 15/00* (2013.01); *F28F 9/0256* (2013.01);
(Continued)

(58) Field of Classification Search
CPC ... F28D 2021/0028; F28F 9/001; F28F 13/06; F28F 2230/00; F28F 2265/12;
(Continued)

(56) References Cited

U.S. PATENT DOCUMENTS

2004/0227920 A1 * 11/2004 Hara .................. G02B 17/0663
                                                         355/67
2005/0016268 A1 *  1/2005 Hugill ...................... G01V 7/02
                                                         73/382 R
(Continued)

FOREIGN PATENT DOCUMENTS

DE    10 2007 052 885 A1    5/2008
DE    10 2009 039 400 A1    3/2011
(Continued)

OTHER PUBLICATIONS

German Office Action, with translation thereof, for corresponding DE Appl No. 10 2015 206 114.0, dated Oct. 29, 2015.

*Primary Examiner* — Mesfin T Asfaw
(74) *Attorney, Agent, or Firm* — Fish & Richardson P.C.

(57) ABSTRACT

The disclosure relates to a cooler for use in a device in a vacuum, wherein the partial pressure of the cooling medium in the vacuum environment during the operation of the cooler is less than $10^{-3}$ mbar. The cooler includes a heat sink, wherein a cavity through which the cooling medium flows is formed in the heat sink, and wherein the heat sink includes a connection element which surrounds one end of the cavity through which the cooling medium flows. The cooler also includes a connecting piece for joining a coolant line to the cavity. The connecting piece includes a jacket secured on the connection element by a thermal connecting process. An intermediate layer is between the jacket and the connection element. The jacket exerts a force in the direction of the connection element so that the intermediate layer is under (Continued)

compressive stress in the radial direction during operation of the cooler.

22 Claims, 6 Drawing Sheets

(51) Int. Cl.
    *G02B 7/18*     (2006.01)
    *F28D 15/00*     (2006.01)
    *F28F 9/02*     (2006.01)
    *H05G 2/00*     (2006.01)

(52) U.S. Cl.
    CPC ............... *G02B 7/181* (2013.01); *G03F 7/70* (2013.01); *G03F 7/70033* (2013.01); *H05G 2/008* (2013.01); *F28F 2230/00* (2013.01); *F28F 2265/16* (2013.01)

(58) Field of Classification Search
    CPC .... F28F 27/00; F28F 3/02; F28F 3/086; F28F 9/0248; F28F 9/0256; G02F 1/133345; G02F 2201/50
    See application file for complete search history.

(56) References Cited

U.S. PATENT DOCUMENTS

| | | |
|---|---|---|
| 2006/0227826 A1 | 10/2006 | Balogh et al. |
| 2008/0073598 A1 | 3/2008 | Moriya et al. |
| 2008/0144202 A1* | 6/2008 | Wevers ................. G02B 7/195 |
| | | 359/845 |
| 2011/0051267 A1 | 3/2011 | Kierey et al. |
| 2016/0320146 A1* | 11/2016 | Hansen .................. F28D 7/024 |

FOREIGN PATENT DOCUMENTS

| | | |
|---|---|---|
| DE | 10 2011 086 565 A1 | 11/2012 |
| DE | 10 2013 111 801 A1 | 3/2014 |
| DE | 10 2012 221 923 A1 | 6/2014 |
| DE | 10 2013 215 197 A1 | 6/2014 |
| WO | WO 2014/083143 | 6/2014 |

* cited by examiner

COOLER FOR USE IN A DEVICE IN A VACUUM

CROSS-REFERENCE TO RELATED APPLICATION

This application claims priority under 35 U.S.C. § 119 to German Application No. 10 2015 206 114.0, filed Apr. 7, 2015. The contents of this application is hereby incorporated by reference in its entirety.

FIELD

The disclosure relates to a cooler for use in a vacuum, for example in a plasma generation chamber of a radiation source for the extreme ultraviolet wavelength range, in a synchrotron source or in a free electron laser. The cooler includes a heat sink, wherein a cavity through which the coolant flows is formed in the substrate material. The cooler further includes a connection piece made of a metal or a metal alloy for connecting a coolant line to the coolant duct and a connecting element for connecting the connection piece to the heat sink, such that, when the connection piece is connected to the heat sink, a continuous line is formed by the coolant duct and the coolant line. The disclosure further relates to an optical element, in particular a reflective optical element, having such a cooler, and to a method for joining a coolant line to a coolant duct in a cooler of a device in a vacuum.

BACKGROUND

Nanostructured and microstructured components for electrical engineering and microsystems engineering are generally produced with the aid of lithographic processes, in which the structures to be generated are imaged on the component on a reduced scale by a mask, which has the structures, via a projection exposure apparatus.

In order to make it possible to satisfy demands for ever smaller structures with adequate resolution, lithography projection exposure apparatuses are increasingly being operated with light in the ultraviolet wavelength range, with the aim of also operating lithography projection exposure apparatuses in the extreme ultraviolet (EUV) wavelength range. EUV projection exposure apparatuses of this type place particular demands on the optical elements for beam influencing. Thus, by way of example, there are virtually no materials available for producing refractive optical elements which have a sufficient transmittance for EUV wavelength ranges. For this reason, primarily reflective optical elements are used for beam influencing in EUV projection exposure apparatuses. EUV projection exposure apparatuses having reflective optical elements are disclosed, for example, in US 2006/0227826 A1 and in DE 10 2007 052 885 A1.

EUV projection exposure apparatuses use devices for generating electromagnetic radiation in the extreme ultraviolet wavelength range (referred to hereinbelow as "EUV radiation sources"). It is known to design EUV radiation sources of this type as LPP (Laser Produced Plasma) radiation sources or as DPP (Discharge Produced Plasma) radiation sources. LPP radiation sources are disclosed, for example, in US 2008/0073598 A1 and DE 10 2011 086 565 A1.

In EUV radiation sources, the plasma for generating radiation is generally generated in a plasma generation chamber, in which it is possible also to arrange optical elements in addition to a mechanism for plasma generation.

To protect the optical elements in the plasma generation chamber, a purge gas or cleaning gas is often conducted through the plasma generation chamber. Furthermore, EUV radiation sources have a subatmospheric-pressure device that can be used to set a subatmospheric pressure (vacuum) in the plasma generation chamber. For plasma quality, it is particularly important that the smallest possible amounts of $O_2$ and $H_2O$ are present in the plasma chamber, and therefore water-conducting lines in particular in the plasma chamber should have a high level of leaktightness. EUV radiation sources having plasma generation chambers, purging devices and subatmospheric-pressure devices are known, for example, from US 2008/0073598 and DE 10 2011 086 565 A1, which have already been mentioned above.

During the operation of an EUV radiation source, the components in the plasma generation chamber and the plasma generation chamber itself are exposed to high levels of thermal loading. For this reason, cooling devices for controlling the temperature of components are often arranged in the plasma generation chamber and are supplied with a cooling medium.

US 2006/0227826 A1 discloses a collector mirror having a cooler for use in a plasma generation chamber of an EUV radiation source. The collector mirror has a substrate with worked-in ducts through which a heat transfer medium can flow. At the points where the ducts open out into a surface of the collector mirror, the ducts are provided with threaded connection pieces, into which a feed line for the heat transfer medium can easily be screwed.

The cooler of the collector mirror disclosed in US 2006/0227826 A1 has the disadvantage that there is the risk of some of the heat transfer medium, at the point of connection between the duct in the substrate and the feed line, escaping into the plasma generation chamber and contaminating it, where it deposits or accumulates on optically effective surfaces of the optical elements, as a result of which the function of the EUV radiation source and of the EUV projection exposure apparatus is adversely affected or the vacuum for the operation is impaired.

DE 10 2009 039 400 A1 discloses a further collector mirror for EUV applications having a cooler with cooling ducts. In the case of this cooler, connections for coolant lines are adhesively bonded on, soldered on or welded on. However, since the connection pieces for the coolant lines and the cooler or the collector mirror are often manufactured from different materials, they generally have different coefficients of thermal expansion, and therefore changes in temperature during the production or during operation of the cooler give rise to stresses in the connecting layer and the components, which can lead to plastic deformation, microfractures in the connecting layer or, in an extreme case, to failure of the connection. Tensile and shear stresses in the adhesive or in the solder or welded layer can moreover have the effect that minimal weak points or leakage ducts present in the connecting layer are widened, and therefore a leakage rate deteriorates with continuing operation of the cooler (in particular in the event of variable thermal loads). An adhesive connection furthermore has the disadvantage that some of the coolant or gases dissolved in the coolant can escape into the surroundings through permeation. This can have the effect that a cooler which has not been rejected upon a final inspection after production becomes leaky during operation and fails.

SUMMARY

The disclosure seeks to make available a cooler for use in a vacuum, which cooler is distinguished by improved and lasting sealing.

The disclosure also seeks to make available an optical element having a cooler for use in a plasma generation chamber of a radiation source for an extreme ultraviolet wavelength range, the cooler being distinguished by improved and lasting sealing.

The disclosure further seeks to make available a method for joining a coolant line to a coolant duct of a cooler of a device in a vacuum, the cooler being distinguished by improved sealing.

In one aspect, the disclosure provides a cooler for use in a device in a vacuum, wherein the partial pressure of the cooling medium in the vacuum environment during the operation of the cooler is less than $10^{-3}$ mbar. The cooler includes a heat sink having a cavity through which the cooling medium flows. The heat sink includes a connection element which surrounds one end of the cavity through. The cooler also includes a connecting piece for joining a coolant line to the cavity. The connecting piece includes a jacket which is secured on the connection element by a thermal connecting process. An intermediate layer is arranged between the jacket and the connection element. The jacket exerts a force in the direction of the connection element so that the intermediate layer is under compressive stress in the radial direction during operation of the cooler.

In another aspect, the disclosure provides an optical element having such a cooler for use in a plasma generation chamber of a radiation source for an extreme ultraviolet wavelength range.

In a further aspect, the disclosure provides a method for joining a coolant line to a cavity through which coolant flows in a cooler of a device in a vacuum. The method includes applying a solder layer to a connection element of a heat sink. The connection element surrounds one end of the cavity. The method also includes making available a connecting piece for joining the coolant line to the cavity, wherein the connecting piece includes a jacket. The method further includes heating the solder layer and the jacket, and positioning the jacket in such a way that the jacket bears on the solder layer. In addition, the method includes cooling the solder layer and the jacket such that the jacket exerts a force in the radial direction on the solder layer and subjects the latter to compressive stress.

A cooler for use in a device in a vacuum, wherein the partial pressure of the cooling medium in the vacuum environment during the operation of the cooler is less than $10^{-3}$ mbar, includes a heat sink, wherein a cavity through which cooling medium flows is formed in the heat sink, and wherein the heat sink includes at least one connection element which surrounds at least one end of the cavity through which cooling medium flows. The connection element of the heat sink can be designed, for example, as a stub, which protrudes from the heat sink, or as an opening in the heat sink. This cooler can be used in a great many devices in a vacuum, for example in a plasma generation chamber of a radiation source for the extreme ultraviolet wavelength range, in a synchrotron radiation source, in a free-electron laser or in other applications in which a high degree of imperviousness of the cooler is involved. The cooler further includes a connecting piece for joining a coolant line to the cavity.

According to the present disclosure, the connecting piece includes a jacket which is secured on the connection element by a thermal connecting process. The thermal connecting process can include the jacket being shrink-fitted, with elastic deformation, or elastic and plastic deformation, of the jacket. The thermal connecting process also includes connections where jacket and connection element can already be matched to each other before heating and, via the heating, the jacket and/or the connection element are elastically and plastically deformed. The jacket can either enclose the connection element or can be arranged inside the connection element. The jacket and the connection element can each have different shapes and cross sections, e.g. cylindrical, conical or non-rotationally symmetrical. An intermediate layer is arranged between the jacket and the connection element, and the jacket exerts a force in the direction of the connection element, in such a way that, during operation of the cooler, the intermediate layer is under compressive stress, mainly in the radial direction. The radial direction is defined here as a direction from the jacket to the connection element, independently of the shape of the jacket and of the connection element.

By virtue of the compressive stress exerted on the connection element by the jacket, microchannels and microfractures in the intermediate layer are prevented or closed, such that the leaktightness of the cooler can be improved. In particular, the leaktightness can be ensured even when temperature changes take place in the operation of the cooler, since the intermediate layer is under compressive stress even in the event of temperature changes in the operation of the cooler, and therefore, despite possibly different coefficients of thermal expansion of the connection element and of the jacket, it is possible to ensure that no microchannels or microfractures form in the intermediate layer.

According to one embodiment, provision can be made that the jacket is produced from a first material, and that the connection element is produced from a second material, wherein the materials have different coefficients of thermal expansion, and wherein the jacket and the connection element are arranged in such a way that the material lying to the outside has a higher coefficient of thermal expansion than the material lying to the inside. It is thus possible to ensure that, when temperature fluctuations occur during operation of the cooler, the material lying in each case to the outside constantly exerts a compressive strength on the intermediate layer.

According to one embodiment, provision can be made that the jacket has been elastically deformed or has been elastically and plastically deformed in the process of connecting to the connection element, that the intermediate layer has been elastically and plastically deformed, and that the connection element has been elastically deformed. Alternatively, if the material of the connection element has a higher coefficient of thermal expansion than the material of the jacket, provision can be made that the connection element has been elastically deformed or has been elastically and plastically deformed in the process of connecting to the jacket, in that the intermediate layer has been elastically and plastically deformed, and in that the jacket has been elastically deformed.

According to one embodiment, provision can be made that the jacket is produced from a metal or from a metal alloy, for example from unhardened high-grade steel, which has good shapeability.

According to one embodiment, provision can be made that the connection element is produced from a brittle hard material, for example from a ceramic material, glass, glass ceramic or silicon. The connection element can in this case be formed integrally with the cooler, or the connection element can be secured on the cooler. In particular, the heat sink and the connection element can be formed from a ceramic material, for example from silicon-infiltrated silicone carbide (SiSiC), Zerodur or glass ceramic, for example ULE (Ultra Low Expansion Glass). Many of these materials, for example SiSiC, are distinguished by a high degree of thermal conductivity and are therefore particularly suitable for use in a heat sink. Other materials, for example Zerodur or glass ceramic, have a particularly low coefficient of thermal expansion, such that they only slightly deform even in the event of considerable fluctuations in temperature during the operation of the cooler.

According to one embodiment, provision can be made that the intermediate layer includes a solder layer. It is possible here to use soft solders, which typically melt at temperatures of 190-250° C. and which are usually based on tin/lead or tin/silver alloys. Alternatively, hard solders can also be used, for example nickel alloys, which are typically worked at temperatures of 600-900° C., or active solders, which are worked at temperatures of over 1000° C. Alternatively, the intermediate layer can also include an adhesive layer, for example epoxy adhesive or ceramic adhesive.

According to a further aspect, the present disclosure includes an optical element having a cooler for use in a plasma generation chamber of a radiation source for an extreme ultraviolet wavelength range, wherein the cooler is designed as described above.

A further aspect of the present disclosure relates to a method for joining a coolant line to a cavity through which coolant flows in a cooler of a device in a vacuum, including:
  applying a solder layer to a connection element of a heat sink, wherein the connection element surrounds one end of the cavity;
  making available a connecting piece for joining the coolant line to the cavity, wherein the connecting piece includes a jacket;
  heating the solder layer and the jacket;
  positioning the jacket in such a way that the jacket bears on the solder layer, and
  cooling the solder layer and the jacket, such that the jacket exerts a force in the radial direction on the solder layer and subjects the latter to compressive stress. The solder layer here connects the jacket to the connection element.

According to one embodiment, provision can be made that the jacket is produced from a first material, and that the connection element is produced from a second material, wherein the materials have different coefficients of thermal expansion, and wherein the jacket and the connection element are arranged in such a way that the material lying to the outside has a higher coefficient of thermal expansion than the material lying to the inside.

According to one embodiment, provision can be made that the solder layer and the jacket are heated to a temperature that is higher than the melting point of the solder present in the solder layer, and that the jacket, upon cooling, is elastically deformed or is elastically and plastically deformed, and such that the solder layer is elastically and plastically deformed.

BRIEF DESCRIPTION OF THE DRAWINGS

Illustrative embodiments of the disclosure are explained in more detail below with reference to drawings, in which.

DETAILED DESCRIPTION

Figure 1:
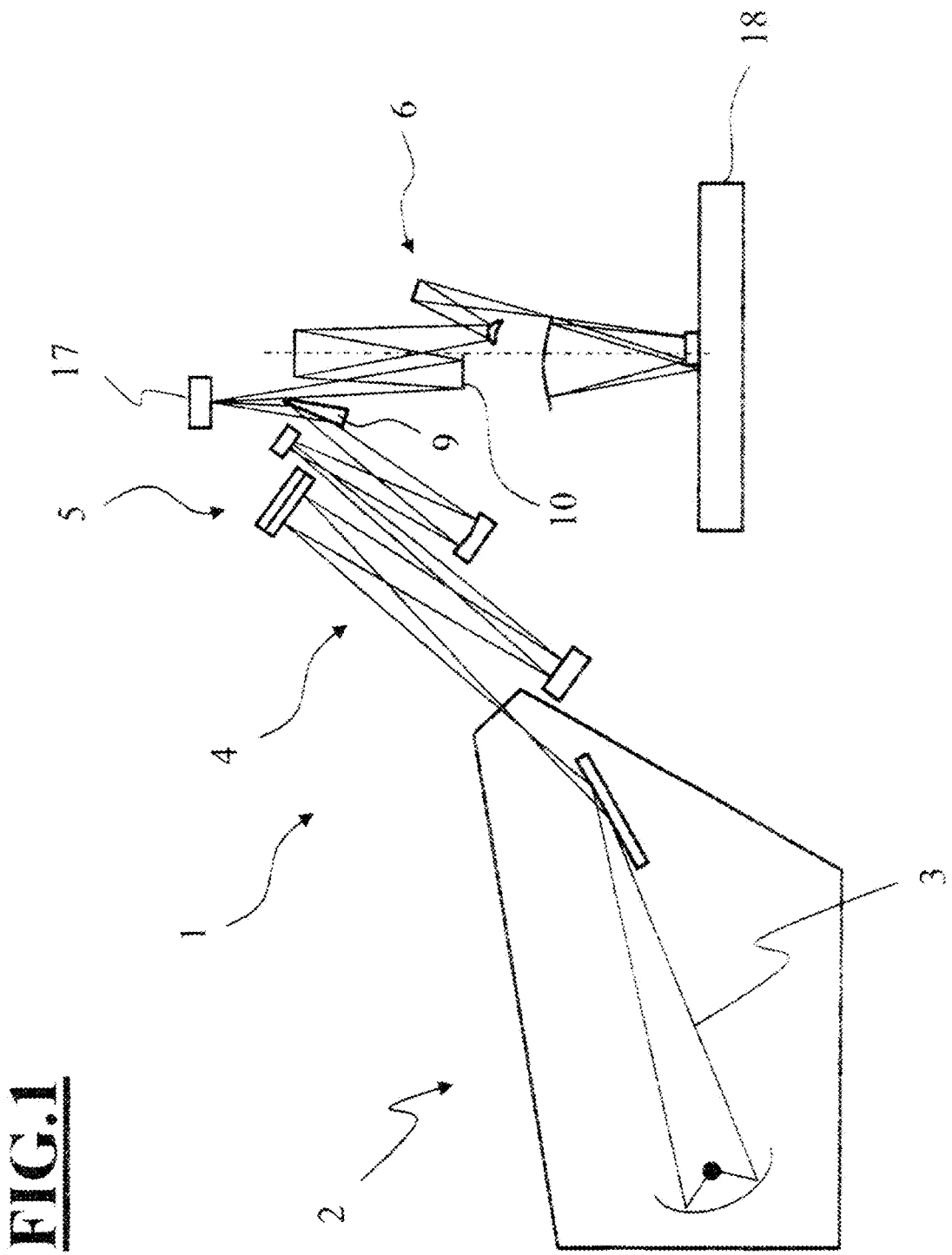
FIG. 1 shows a schematic view of a projection exposure apparatus for EUV uses.

Firstly, the fundamental design of a microlithographic EUV projection exposure apparatus will be described with reference to FIG. 1. A projection exposure apparatus 1 of this type has an EUV radiation source 2, in which electromagnetic radiation in an EUV wavelength range, i.e. with a wavelength of between 10 and 15 nm, in particular with a wavelength of 13.5 nm, is generated, concentrated and emitted in the direction of an illumination system 4. The illumination system 4 includes a first group of mirrors 5, with the aid of which the EUV beam is shaped, such that a mask 17 is illuminated. The mask 17 bears a microstructure which is imaged onto a wafer 18 on a reduced scale. The mask 17 is imaged onto the wafer 18 with the aid of a projection optical unit 16 made up of a second group of mirrors 6.

Figure 2:
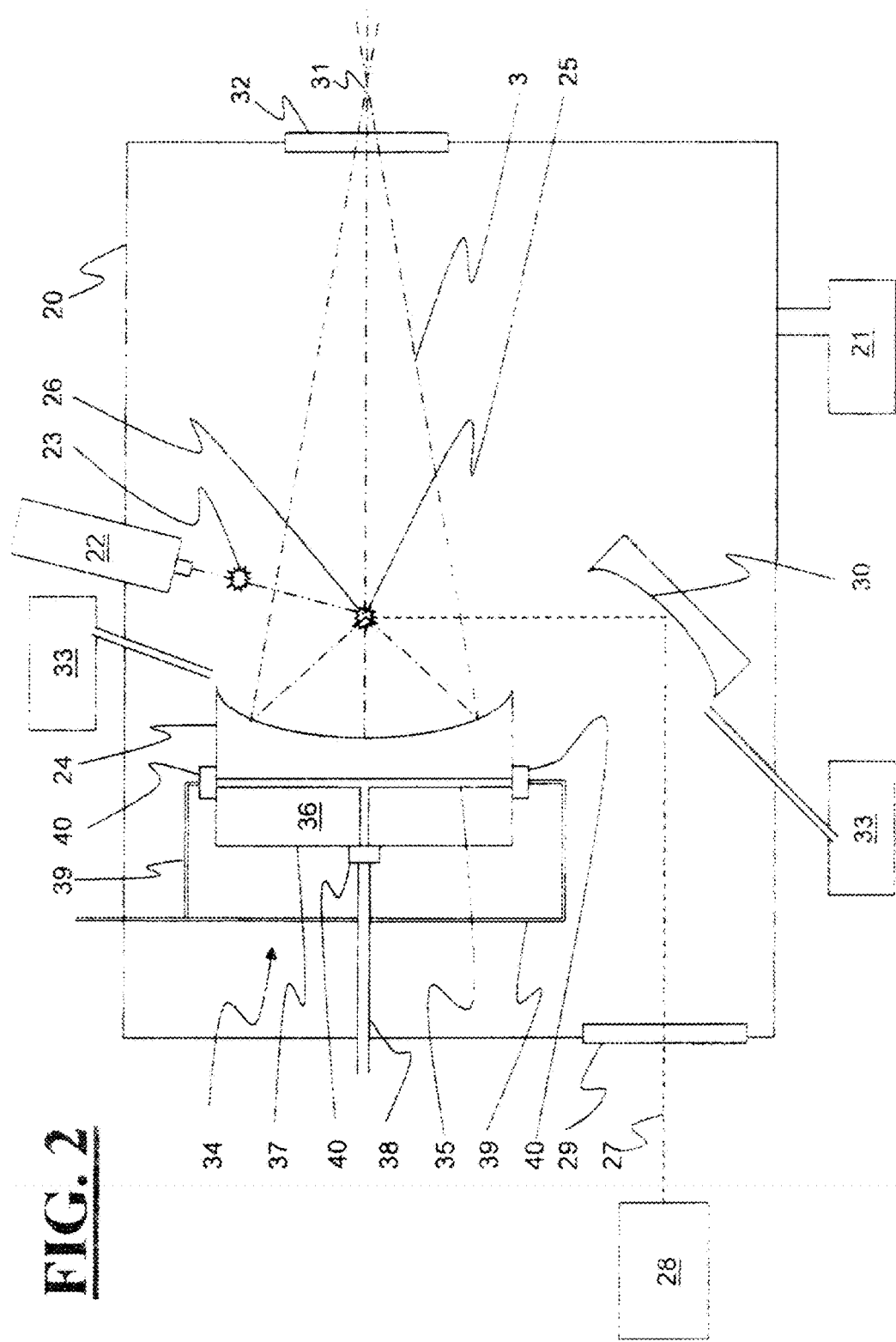
FIG. 2 shows a schematic view of a plasma generation chamber with a cooler according to the disclosure.

FIG. 2 shows, by way of example, the design of an EUV radiation source 2. The EUV radiation source is designed as an LPP radiation source and includes a plasma generation chamber 20, in which the plasma is formed. A vacuum pump 21 can be used to generate a subatmospheric pressure, which can be, for example, 1 mbar absolute or less, in the plasma generation chamber 20. The partial pressure of constituents that are not hydrogen is usually much less than 1 mbar. This facilitates the formation of a plasma. The subatmospheric pressure moreover leads to reduced absorption of the EUV radiation.

A plasma generation material 23 can be introduced, preferably in droplets, into the plasma generation chamber with the aid of an injection device 22. Tin (Sn), gadolinium (Gd) or xenon (Xe) can be used, for example, as the plasma generation material 23. The injection device 22 is designed and oriented in this case in such a way that the droplets 26 of the plasma generation material 23 which are released by the injection device 22 are conveyed into a first focal point 25 of a, for example, ellipsoidal collector 24.

A laser 28 preferably operating in a pulsed fashion is arranged outside the plasma generation chamber and can be used to generate a laser beam 27, which can be guided through an entrance window 29 into the plasma generation chamber 20. After it has entered the plasma generation chamber 20, the laser beam 27 is deflected at a mirror 30 in the direction of the first focal point of the collector 24. The cycle rates and the orientations of the laser 28 and of the injection device 22 are in this case synchronized with one another in such a way that the laser beam is incident on a droplet 26 of the plasma generation material 23 in the first focal point or as close as possible to the first focal point. The droplet 26 evaporates abruptly as a result of the laser irradiation and changes to a plasma, with EUV radiation 3 being created.

The EUV radiation 3 generated in this way is initially non-directional. A large part of the EUV radiation is concentrated by the collector mirror and, after passing through an exit hole 32 of the plasma generation chamber 20, is focussed in a second focal point 31 of the, for example, ellipsoidal collector 24.

The collector 24 in particular, in the immediate vicinity of which the plasma is generated, is exposed to high thermal loading and also to high radiation loading and possible bombardment by droplets or droplet residues of the plasma generation material or chemical reaction components thereof, and, consequently, overheating and damage can occur in particular on the surface of the collector and deposits can form. This also applies to a diminished extent to the other optical elements arranged in the plasma generation chamber, such as the mirror 30. Damage or deposits of this nature impair the reflection behaviour of the optical elements and lead to a deterioration in the efficiency of the EUV projection exposure apparatus. In order to reduce this risk, the EUV radiation source 2 has purging devices 33, which make it possible to supply a purge gas for protecting the optical components. The purge gas used can be, for example, inert, inactive gases such as argon Ar, helium He, nitrogen $N_2$ or krypton Kr, or else reactive gases such as $H_2$, with the aid of which it is possible in particular to bring about a cleaning chemical reaction with the deposits present on the surfaces of the optical elements.

On account of the high thermal loading, optical elements in a plasma generation chamber often include a cooler, or they are coupled to a cooler via heat-conducting connections. In this illustrative embodiment, the collector 24 includes a cooler 34 having a heat sink 37 made of a substrate material 36, into which a cooling duct 35 has been worked. The cooler 34 is designed to dissipate quantities of heat of 5 kW and more. The substrate material 36 used is preferably a material having a thermal conductivity of more than 50 W/mK, in order to ensure a good transfer of heat from a reflective surface of the collector to the cooling duct 35 in the substrate material 36. In particular, the substrate material can include a ceramic material such as silicon carbide SiC or silicon-infiltrated silicon carbide SiSiC. Generally, according to one embodiment, brittle hard materials with low thermal expansion are used, for example ceramic material, glass, glass ceramic or silicon. Alternatively, as is described below with reference to FIG. 9, the cooler 34 can also be produced from metal or from another material with high thermal expansion.

A cooling medium can flow through the cooling duct 35 and is fed to and carried away from the cooler via coolant lines 38, 39. In this illustrative embodiment, the cooling medium provided is water. The coolant lines 38, 39 are preferably produced from high-grade steel and can include various flow-conducting elements such as pipes, vacuum feedthroughs or bellows.

The coolant lines 38, 39 are connected to the heat sink 36 via connecting pieces 40, the connecting pieces 40 being configured either as a separate connecting element having a first connector for connecting to the heat sink and a second connector for connecting to the coolant line 38, 39 or as an integral component part of the coolant line 38, 39. If the connecting piece is designed as a separate connecting element, the coolant lines 38, 39 can be connected for example via a VCR connection made of high-grade steel.

If the cooler and the reflective optical element are embodied as an integral component, inlet and outlet openings of the cooling duct and also the connecting pieces assigned to the inlet and outlet openings are preferably arranged, as shown in FIG. 2, on those sides of the cooler 34 which are remote from the reflective side. In this way, connection forces which can arise at the points of connection between the coolant line and the heat sink are kept away from the optically effective side of the optical element, and therefore the risk of deformations is reduced.

All the connections are vacuum-tight, so as to be able to ensure that no coolant escapes and deposits on the optical surfaces or impairs the vacuum.

Figure 3:
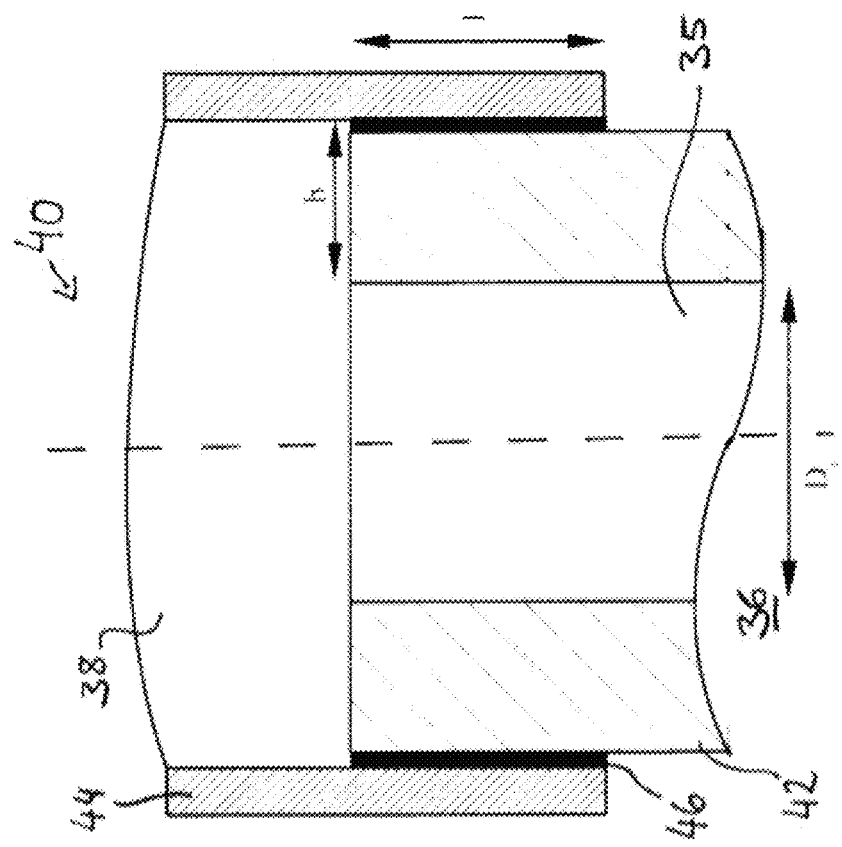
FIG. 3 shows an embodiment of a connecting piece joined to a connection stub of a heat sink.

FIG. 3 shows a detailed view of an embodiment of the cooler 34. Here, the substrate material 36 at one end of the cooling duct 35 is shaped in such a way that a connection stub 42 is formed as a connection element on which the connecting piece 40 can be secured. Via the connecting piece 40, the coolant line 38, 39 can be then connected to the cooling duct 35.

The connecting piece 40 includes a jacket 44, which encloses at least a portion of the connection stub 42 in the manner of a flange. A solder layer 46 is arranged between the jacket 44 and the connection stub 42. The coolant line 38, 39 is bound to the jacket 44, for example via a VCR connection made of high-grade steel. The jacket 44 is produced from a metal or from a metal alloy, for example high-grade steel, and is secured on the connection stub 42 by shrink-fitting. During the shrink-fitting on the connection stub 42, the jacket 44 is widened as far as the plastic deformation range, such that the jacket 44, after cooling, transmits a compressive stress to the connection stub 42, wherein the solder layer arranged between the connection stub 42 and the jacket 44 is compressed.

In the embodiment shown by way of example in FIG. 3, the internal diameter $D_i$ of the connection stub 42 is in the range between 4 and 20 mm, the wall thickness b is at least 3 mm, and the length l by which the jacket 44 overlaps the connection stub 42 is between 5 and 20 mm.

When cooled from soldering temperature to room temperature, the solder in the cylindrical gap between jacket 44 and connection stub 42 experiences compressive stresses, which tend to narrow rather than widen any leakage channels introduced by the soldering process and, therefore, do not lead to a deterioration of the leakage rate. As a result of the shrink-fitted jacket, the portion of the connection stub 42 surrounded by the jacket 44 experiences compressive stresses, as will be explained in more detail below. Ceramic materials are usually not sensitive to compressive stresses up to a maximum limit of 200 MPa. However, in the embodiment shown in FIG. 3, tensile stresses arise on the surface in the area directly below the jacket 44, which tensile stresses should be minimized in the case of ceramic materials. These tensile stresses increase the higher the processing temperature (e.g. during soldering), the higher the yield strength of the metal of the jacket 44 and the greater the difference between the coefficients of thermal expansion (CTE) of jacket 44 and connection stub 42. The maximum stress in the connection stub 42 can be influenced through suitable choice of the parameters.

An example of a value for the maximum tensile stress, corresponding to a failure probability of $<10^{-5}$, is approximately 50 MPa a for SiSiC as substrate material. This maximum stress is reached, for example for a connection stub 42 with an external diameter of 25 mm and a wall thickness of ca. 5 mm, and for a jacket with a wall thickness of 1 mm, at a soldering temperature of 220° C., a CTE of the metal jacket of $16*10^{-6}$ $K^{-1}$, a CTE of the ceramic material of $2.5*10^{-6}$ $K^{-1}$ and the yield strength of 220 MPa of the high-grade steel chosen as jacket material. Upon cooling from soldering temperature to room temperature, the high-grade steel from which the jacket 44 is formed already experiences plastic deformation here. If a metal material with a higher yield strength is chosen for the jacket 44, the maximum tensile stress in the ceramic material of the connection stub 42 is also greater after the shrink-fitting of the jacket 44. To keep the maximum tensile stresses in the connection stub 42 low, it is possible to use ductile, deformable high-grade steels with a yield strength Rp 0.2 in the range between 200 and 250 MPa.

Figure 4:
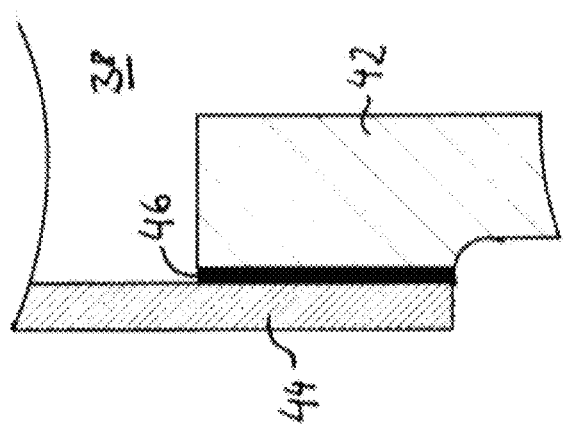
FIG. 4 shows a further embodiment of a connecting piece joined to a connection stub of a heat sink.

FIG. 4 shows a further embodiment of the connecting piece 40 joined to the connection stub 42, wherein a recess 48 is provided in the connection stub for deformation decoupling and for relief of shear stresses in the connection stub 42 and in the solder layer. In the example shown in FIG. 3, the area of maximum tensile stress in the connection stub 42 lies in the transition region between the portion of the connection stub 42 surrounded by the jacket 44 and the portion of the connection stub 42 not surrounded by the jacket 44. In order to achieve stress relief in this area, it can first be ensured that the area of maximum tensile stress is ground with good quality (for example with a mean roughness value Ra<1.6) and is free or microfractures. Further relief can be achieved by a relief slit or by the recess 48. The recess 48 can be configured here, for example, by a simple radius in the form of a portion of a circle, such that the external diameter of the connection stub 42 in the portion not surrounded by the jacket 44 is smaller than in the portion surrounded by the jacket 44.

Figure 5:
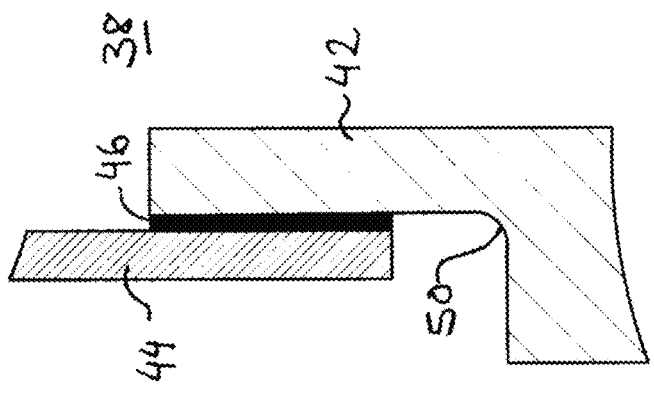
FIG. 5 shows a further embodiment of a connecting piece joined to a connection stub of a heat sink.

Alternatively, as is shown in FIG. 5, a deformation decoupling can also be achieved by configuring a collar 50 in the connection stub, such that the external diameter of the connection stub 42 in the portion not surrounded by the jacket 44 is larger than in the portion surrounded by the jacket 44.

Figure 6:
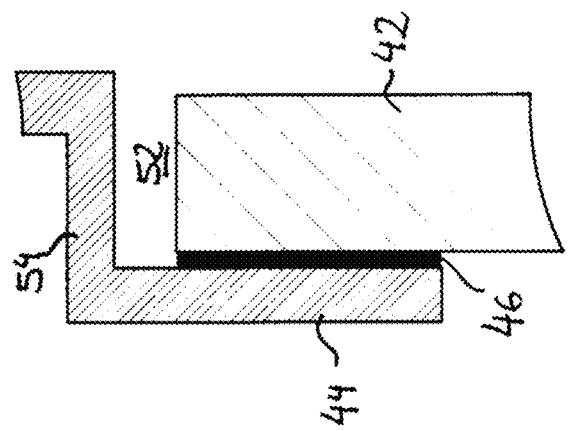
FIG. 6 shows a further embodiment of a connecting piece joined to a connection stub of a heat sink.

FIG. 6 shows a further embodiment in which a gap 52 is provided in order to permit stress decoupling of the area of the jacket 44 shrink-fitted onto the connection stub 42 and of the connection between the jacket 44 and the attached coolant line 38, which gap 52 is formed between an end area of the connection stub 42 and a shoulder 54 of the jacket 44. This gap 52 serves as a transition from a larger diameter in the connection stub 42 to a smaller diameter of the coolant line in the jacket 44.

Figure 8:
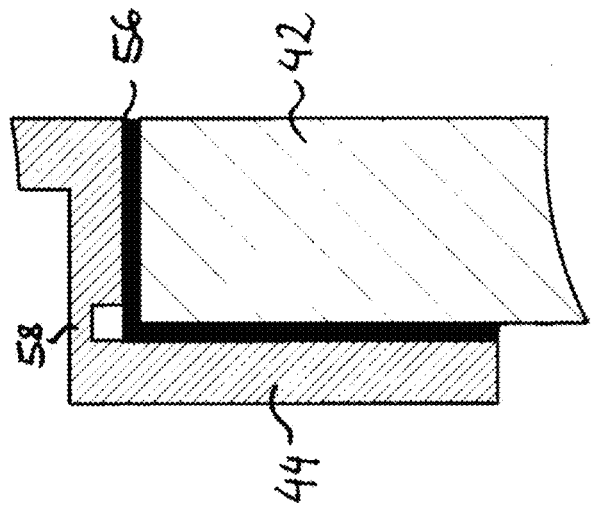
FIG. 8 shows a further embodiment of a connecting piece joined to a connection stub of a heat sink.
Figure 7:
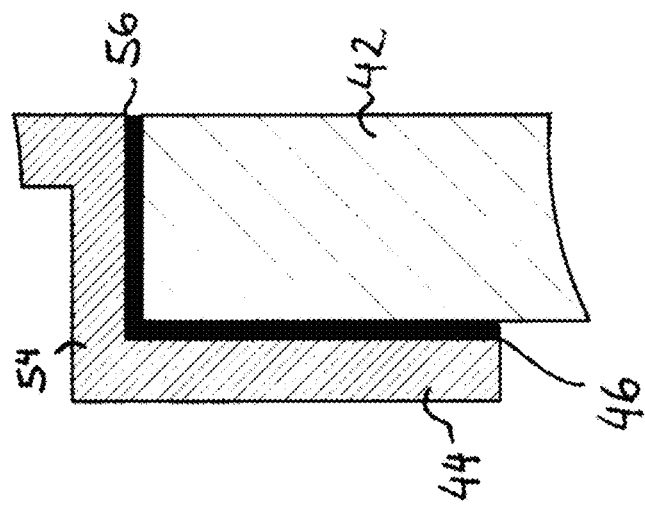
FIG. 7 shows a further embodiment of a connecting piece joined to a connection stub of a heat sink.

In the embodiment shown in FIG. 7, the above-described gap 52 is replaced by a further solder layer 56 between the shoulder 54 of the jacket 44 and the planar end area of the connection stub 42. This additional solder layer can be used in particular when the cooling duct is intended not to experience any change of diameter at the transition to the coolant line. In this case, in order to permit stress decoupling of the two solder layers, a flexible area 58 (see FIG. 8), for example a membrane or generally a tapered portion of the jacket 44, can be provided so that the solder layer 56 on the front face of the connection stub 42 experiences the least possible shearing stress, which could lead to the solder peeling off in this area.

Figure 9:
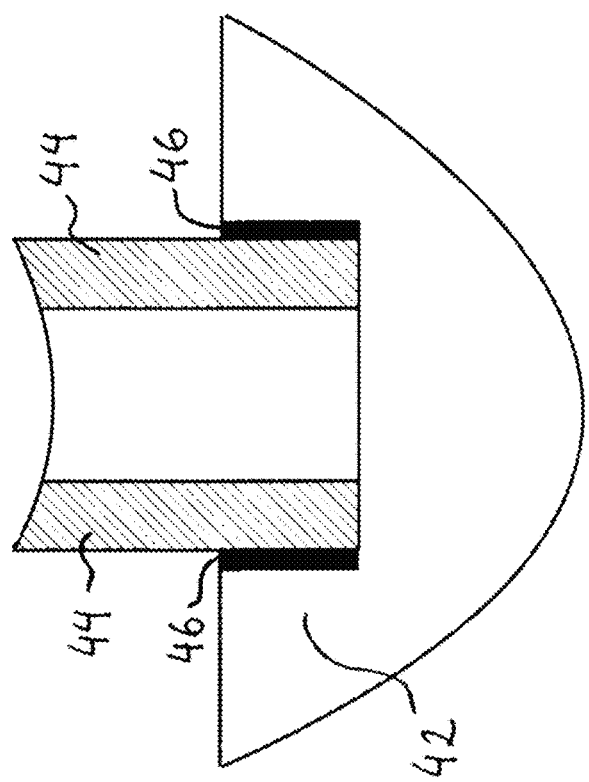
FIG. 9 shows an embodiment in which a jacket of a connecting piece is attached inside a connection element of a heat sink.

FIG. 9 shows an illustrative embodiment in which the connection element 42 of the heat sink has a higher coefficient of thermal expansion than the material of the jacket 44. This situation arises, for example, when the collector 24 includes a cooler 34 with a heat sink 37 made of metal, in order to achieve a particularly high level of thermal conductivity of the heat sink 37.

In this case, the connection element 42 is shrink-fitted onto the jacket 44 such that, in this illustrative embodiment too, the solder layer 46 is constantly under compressive stress. The compressive stress is generated here by the fact that the connection element 42 lying to the outside exerts a force on the jacket 44 in the radial direction and thus compresses the solder layer 46.

In the above description of illustrative embodiments of the present disclosure, one or more solder layers are described in each case which are arranged between the jacket 44 and the connection stub 42. These solder layers can be applied by conventional soldering methods, for example soft soldering, hard soldering or active soldering. As alternatives to soldering, other methods of cohesive bonding can be used, for example gluing, such that instead of the above-described solder layer an adhesive layer is then arranged between the jacket 44 and the connection stub 42.

The high thermal loads which occur in plasma generation chambers of EUV projection exposure apparatuses often involve the use of coolers in order to dissipate the heat. The coolers in this case are to withstand fluctuating thermal loads and also bombardment with particles and should nevertheless have at most a low leakage rate in the prevailing vacuum environment. In order to ensure reliable operation of the plasma generation chamber, it should be ensured in particular that no or very little coolant or coolant constituents pass into the vacuum environment. Therefore, particularly high demands should be placed on the design of the connections between the coolers and the connection lines.

The cooler according to the disclosure is distinguished by a particularly high quality and durability of the seal under the conditions which prevail in plasma generation chambers. The quality of a seal can be determined with the aid of the leakage rate upon filling with helium. The leakage rate $Q_l$ is defined here as $Q_l=(\Delta p*V)/\Delta t$, where $\Delta p$=pressure difference, V=fill volume and $\Delta t$=measurement time. The cooler according to the disclosure permits leakage rates of less than $10^{-5}$ mbar*l/s, in particular also of less than $10^{-6}$ mbar*l/s. In addition, the cooler according to the disclosure is distinguished by a very small permeation of water and oxygen.

The use of a plastically deformed jacket which is made of a metal or of a metal alloy, and which is secured by being shrink-fitted on a connection stub of the heat sink, ensures that the jacket exerts a constant compressive stress on the connection stub during the operation of the cooler. An intermediate solder layer or adhesive layer improves the leaktightness of the cooler, since microchannels present in the intermediate layer are likewise subjected to compressive stress by the jacket and are thereby reduced.

What is claimed is:

1. A cooler, comprising:
    a heat sink having a cavity through which a cooling medium flows during operation of the cooler, the heat sink comprising a connection element surrounding an end of the cavity;
    a connecting piece configured to connect the heat sink to a coolant line through which the cooling medium flows during operation of the cooler, the connecting piece comprising:
    a jacket thermal connectedly secured to the connection element; and
    an intermediate layer between the jacket and the connection element,
    wherein:
        the jacket exerts a force toward the connection element so that the intermediate layer is under compressive stress in a radial direction;
        an entire inner surface of the intermediate layer is in gap-free direct contact with an outer surface of the connection element; and an entire outer surface of the intermediate layer is in gap-free direct contact with the inner surface of the jacket.

2. The cooler of claim 1, wherein the cooler is configured to be used in a vacuum in which a partial pressure of the cooling medium in the vacuum environment during the operation of the cooler is less than $10^{-3}$ millibar.

3. The cooler of claim 1, wherein:
the jacket is outside the connection element;
the jacket comprises a first material having a coefficient of thermal expansion;
the connection element comprises a second material having a coefficient of thermal expansion;
the coefficient of thermal expansion of the first material is greater than the coefficient of thermal expansion of the second material.

4. The cooler of claim 1, wherein:
the connection element is outside the jacket;
the jacket comprises a first material having a coefficient of thermal expansion;
the connection element comprises a second material having a coefficient of thermal expansion;
the coefficient of thermal expansion of the first material is less than the coefficient of thermal expansion of the second material.

5. The cooler of claim 1, wherein the jacket is elastically deformed or plastically deformed.

6. The cooler of claim 5, wherein the intermediate layer is elastically deformed or plastically deformed.

7. The cooler of claim 1, wherein the intermediate layer is elastically deformed or plastically deformed.

8. The cooler of claim 1, wherein the jacket comprises a material selected from the group consisting of metals and metal alloys.

9. The cooler of claim 1, wherein the connection element comprises a ceramic material.

10. The cooler of claim 1, wherein the connection element comprises silicon.

11. The cooler of claim 1, wherein the connection element comprises glass.

12. The cooler of claim 1, wherein the intermediate layer comprises solder.

13. The cooler of claim 1, wherein the intermediate layer comprises an adhesive.

14. The cooler of claim 1, wherein the intermediate layer comprises a material selected from the group consisting of epoxy adhesives and ceramic adhesives.

15. An arrangement, comprising:
an optical element; and
a cooler according to claim 1,
wherein the cooler is operatively connected to the optical element so that, during operation of the arrangement, the cooler cools the optical element.

16. A system, comprising:
an EUV light source; and
an illumination system comprising a plurality of mirrors configured to transfer EUV light generated by the EUV light source to a mask comprising structures,
wherein the EUV light source comprises a cooler according to claim 1.

17. A projection exposure apparatus, comprising:
an EUV light source;
an illumination system comprising a plurality of mirrors configured to transfer EUV light generated by the EUV light source to a mask comprising structures; and
a projection optical unit configured to image illuminated structures of the mask onto a wafer,
wherein the EUV light source comprises a cooler according to claim 1.

18. A method, comprising:
applying a solder layer to a connection element of a heat sink, the connection element surrounding an end of a cavity in the heat sink;
heating a solder layer and a jacket;
positioning the jacket so that the jacket bears on the solder layer; and
cooling the solder layer and the jacket so that the jacket exerts a force in a radial direction on the solder layer to subject the solder layer to a compressive stress,
wherein:
an entire inner surface of the solder layer is in gap-free direct contact with an outer surface of the connection element; and
an entire outer surface of the solder layer is in gap-free direct contact with the inner surface of the jacket.

19. The method of claim 18, wherein:
the jacket is outside the connection element;
the jacket comprises a first material having a coefficient of thermal expansion;
the connection element comprises a second material having a coefficient of thermal expansion;
the coefficient of thermal expansion of the first material is greater than the coefficient of thermal expansion of the second material.

20. The method of claim 18, wherein:
the connection element is outside the jacket;
the jacket comprises a first material having a coefficient of thermal expansion;
the connection element comprises a second material having a coefficient of thermal expansion;
the coefficient of thermal expansion of the first material is less than the coefficient of thermal expansion of the second material.

21. The method of claim 18, wherein the solder layer comprises a solder, and the method comprises heating the solder layer and the jacket to a temperature higher than a melting point of the solder so that, upon cooling, the solder elastically deforms to connect the jacket and the connection element.

22. The method of claim 18, wherein the solder layer comprises a solder, and the method comprises heating the solder layer and the jacket to a temperature higher than a melting point of the solder so that, upon cooling, the solder elastically deforms and plastically deforms to connect the jacket and the connection element.

* * * * *